United States Patent [19]
Fujimoto

[11] Patent Number: 5,740,488
[45] Date of Patent: Apr. 14, 1998

[54] RESIST DEVELOPING APPARATUS WITH SELECTABLE SPRAY AND DRIP NOZZLES

[75] Inventor: Satoshi Fujimoto, Miyagi-ken, Japan

[73] Assignee: Frontec Incorporated, Tokyo, Japan

[21] Appl. No.: 607,478

[22] Filed: Feb. 27, 1996

Related U.S. Application Data

[62] Division of Ser. No. 551,497, Nov. 1, 1995, abandoned.

[30] Foreign Application Priority Data

Nov. 2, 1994 [JP] Japan .................................. 6-269543

[51] Int. Cl.$^6$ .................................................. G03D 3/02
[52] U.S. Cl. .......................... 396/604; 396/611; 396/627
[58] Field of Search ................................ 354/317, 325; 134/153, 140, 144, 148; 118/52, 54, 56, 320, 321; 430/325, 329, 330, 331, 396, 347; 239/214, 379, 222–224; 396/611, 604, 627

[56] References Cited

U.S. PATENT DOCUMENTS 4,564,280  1/1986  Fukuda .................................. 354/317
4,808,513  2/1989  Lazarus et al. ........................ 430/331
5,342,738  8/1994  Ikeda ..................................... 430/325

FOREIGN PATENT DOCUMENTS 1-302725  12/1989  Japan .................................. 396/935

*Primary Examiner*—D. Rutledge
*Attorney, Agent, or Firm*—Guy W. Shoup

[57] ABSTRACT

The present invention provides a resist developing method and apparatus which achieves high in-plane uniformity and high reproducibility of resist pattern accuracy and low consumption of developer. The resist developing method sprays developer on a patterned resist formed on a substrate while rotating the substrate at high speed, drips the developer on the resist while rotating the substrate at low speed, and then, stops the substrate to hold the developer on the surface of the resist. The resist developing apparatus has a rotating substrate holder whose rotation speed is variable, a nozzle for supplying developer onto a substrate, and a device for supplying the developer to the nozzle. The nozzle includes a spray nozzle and a drip nozzle.

4 Claims, 1 Drawing Sheet

RESIST DEVELOPING APPARATUS WITH SELECTABLE SPRAY AND DRIP NOZZLES

This application is a division of application Ser. No. 08/551,497 filed Nov. 1, 1995, now abandoned.

BACKGROUND OF THE INVENTION

1. Field of the Invention

The present invention relates to a resist developing method and apparatus, and more particularly, to a resist developing method and apparatus which achieves high in-plane uniformity of resist pattern accuracy and low consumption of developer.

2. Description of the Related Arts

A thin-film transistor (TFT) substrate used to drive a liquid crystal display device is produced by repeatedly subjecting a square glass substrate or the like to a film forming process and a photolithographic process.

In the photolithographic process, a resist is applied onto a film and exposed in a desired pattern. After the resist is developed, the film is patterned by etching through the use of the resist as a mask. The accuracy and uniformity of film patterning are important to maintain a uniform TFT characteristic, and the uniformity of resist development for determining the above accuracy and uniformity is extremely important.

In general, the resist is developed by spray development or puddle development. In puddle development, developer is dripped on a resist surface to cover the whole resist surface while rotating a substrate at a rotation speed of approximately several tens rpm, and then, the substrate is stopped and left for a predetermined time, thereby developing the resist. This method has the disadvantage in that the developer is difficult to spread over the entire substrate, by which the development start time varies on the substrate surface and uniform development is not achieved. Furthermore, variations in substrates are wide. This tendency becomes more outstanding as the size of the substrate increases. Although the spreading condition of the developer is improved by dripping a lot of developer on the substrate, it is not sufficient.

On the other hand, the spray development sprays developer on a resist while rotating a substrate at a high speed of approximately 1000 rpm to 2000 rpm. If the substrate is large, uniform spraying on the entire substrate is difficult. Furthermore, since the developer flows outward from the center of the substrate, there is a difference in developing speed between the center portion which is always in contact with fresh developer and the peripheral portion which is in contact with developer containing some dissolved resist. This results in an insufficient in-plane uniformity of resist patterns. In addition, the amount of developer used is large.

Accordingly, a resist developing method capable of achieving high in-plane uniformity and high reproducibility has been demanded to cope with upsizing of substrates.

SUMMARY OF THE INVENTION

In view of the above circumstances, the present invention is aimed at providing a resist developing method and apparatus which achieves high in-plane uniformity and high reproducibility of resist pattern accuracy and low consumption of developer.

According to an aspect of the present invention, there is provided a resist developing method comprising the steps of spraying developer on a patterned resist formed on a substrate while rotating the substrate at high speed, dripping the developer on the resist while rotating the substrate at low speed, and stopping the substrate to hold the developer on the surface of the resist.

It is preferable to move a drip position from the center toward the outer periphery of the substrate while dripping the developer, and to perform the spraying for three seconds or less.

The developing method of the present invention is, in particular, applied preferably to a square substrate.

According to another aspect of the present invention, there is provided a resist developing apparatus comprising a rotating substrate holder whose rotation speed is variable, a nozzle for supplying developer onto a substrate, and a means for supplying the developer to the nozzle, said nozzle including a spray nozzle and a drip nozzle. It is preferable to provide a means for moving a jetting portion of the drip nozzle from the center to the outer periphery of the substrate.

The spray nozzle and the drip nozzle are connected to the means for supplying the developer through at least one selector valve.

DETAILED DESCRIPTION OF THE PREFERRED EMBODIMENTS

The operation of the present invention will be described with reference to FIGS. 1A, 1B and 1C.

Figure 1A:
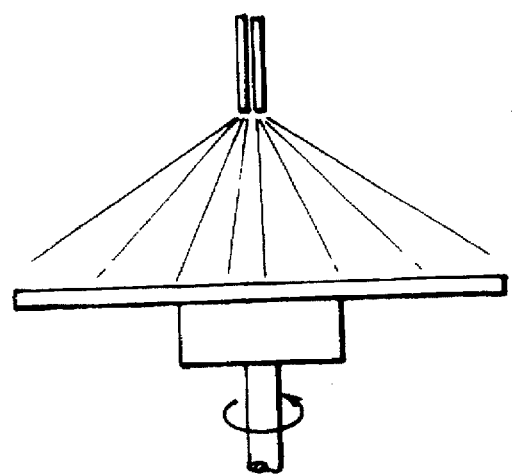
FIGS. 1A, 1B and 1C are conceptual views for explaining a resist developing method of the present invention.

In the present invention, developer is sprayed from a spray nozzle onto a resist surface while rotating a substrate at high speed (FIG. 1A). This process gives uniform wettability of the resist surface with respect to the developer so that the developer dripped in the next process uniformly and quickly spreads over the entire resist surface. In the present invention, the high-speed rotation means a rotation at a sufficient speed for the developer to make the resist surface uniformly wet, that is, above 200 rpm. In general, a number of rotations within a range of 500 rpm to 2000 rpm is preferable. A preferable spraying time is three seconds or less.

Figure 1B:
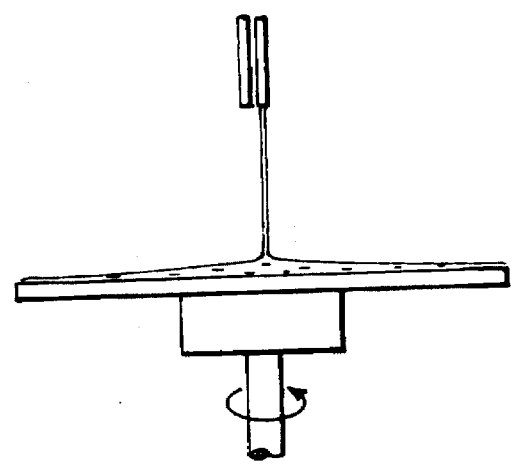

Next, the whole resist surface is covered with the developer by dripping the developer from a drip nozzle onto the substrate while rotating the substrate at low speed (FIG. 1B). At this time, fresh developer can be supplied onto the whole resist surface and the development start time and the developing speed can be made more uniform on the surface by moving the drip nozzle outward from the center of the substrate. Therefore, uniformity of development is further improved. This movement of the drip nozzle is particularly effective on a large substrate. Furthermore, the rotation at low speed means a rotation at a lower speed than the rotation of the substrate in the above-mentioned spray coating, at which the dripped developer is not blown off, and spreads promptly to such a degree as to have no influence on the start of development on the resist. Specifically, the rotation speed is approximately 30 rpm to 80 rpm. This process takes approximately 2 to 5 seconds.

Figure 1C:
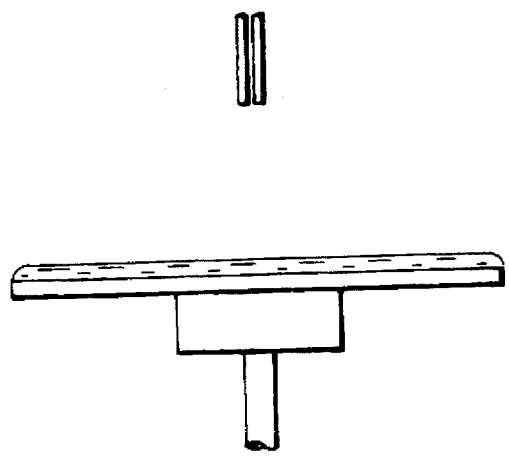

Finally, the rotation of the substrate is stopped and the substrate is left for a predetermined time for development (FIG. 1C). Then, developer removal, rinsing and drying are performed by rotating the substrate, thereby completing the development.

According to the above-mentioned developing method of the present invention, since the development start time and the developing speed can be made uniform at all points on the resist surface, it is possible to substantially reduce variations in resist pattern width which are found particularly at the corners of a square substrate. Furthermore, since the development start time is stabilized, the uniformity of substrates is enhanced.

In the present invention, the developer is jetted from the nozzles only in the spraying and dripping processes, which contributes to a remarkably smaller amount of developer used than that in spray development.

Although the present invention is particularly effective on a square substrate, it may be, as a matter of course, applied to a circular substrate such as a silicon substrate.

The resist to be used in the present invention may be positive or negative. For example, a Novorak photoresist and a cyclorubber negative resist are preferably used.

As the developer, a TMAH (tetramethylammonium hydroxide) alkali developer and a xylene developer are used respectively corresponding to the above resists.

In the developing apparatus of the present invention, the spray nozzle and the drip nozzle are connected to a developer supply means (for example, a developer tank pressurized by nitrogen gas) through a selector valve, and the developer is selectively discharged from the spray nozzle or the drip nozzle by the selector valve. The selector valve may be a three-way valve or a combination of two-way valves.

The means for moving the jetting portion of the drip nozzle may be a mechanism for turning the nozzle on the upstream side of the jetting portion or a mechanism for moving the nozzle parallel.

The spray nozzle and the drip nozzle may be mounted separately, or jetting portions of the nozzles may be mounted on a single support member and connected to respective developer pipes to be supplied with developer.

[EXAMPLES]

The present invention will now be described in conjunction with examples.

(Example 1)

After a positive photoresist (OFPR-800 from Tokyo Ohka Kogyo) of 1 μm in thickness was applied onto a glass substrate of 6 inches square and pre-baked, it was exposed with a mask having a pattern of 2 μm in width.

Next, the substrate was set on a substrate holder of a spin developer as shown in FIG. 1A, and (1) spraying, (2) dripping and (3) static development were performed successively on the following conditions shown in Table 1. As the developer, an alkali developer (MFCD-26 from Shipley) was used.

TABLE 1

|  | (a) Spray | (b) Dripping | (c) Static Development |
|---|---|---|---|
| Substrate Rotation Speed (rpm) | 1000 to 1500 | 50 | — |
| Spray Pressure (Kg/cm²) | 1 | — | — |
| Amount of Developer Used (cc) | 8 | 8 | — |
| Developer Temperature (°C.) | 23 | 23 | 23 |
| Processing Time (sec) | 3 | 3 | 54 |

(Comparative Examples 1 and 2)

For comparison, spray development (a) was only performed for 60 seconds (Comparative Example 1).

Furthermore, as Comparative Example 2, drip development (b) and static development (c) were performed for 3 seconds and 57 seconds, respectively.

Measured line widths of resist patterns in Example 1 and Comparative Examples 1 and 2 are shown in Table 2. The line widths were measured at fifty points on the substrate by using a line width measurement device (LAMPAS from Nikon), and the average value the maximum deviation of the measurements were obtained in each of the examples.

TABLE 2

|  | Average | Deviation | |
|---|---|---|---|
| Example 1 | 2.01 μm | +1.7% | −1.4% |
| Comparative Example 1 | 1.95 μm | +6.0% | −5.4% |
| Comparative Example 2 | 2.04 μm | +6.1% | −6.6% |

Table 2 thus reveals that the developing method of this Example 1 makes the in-plane uniformity of resist patterns remarkably higher than the conventional developing method.

Furthermore, the same development as Example 1 was conducted on ten substrates, and development uniformity of the substrates was examined. The average value of the measurements was found and evaluated in a similar manner to Example 1. As a result, the average value of ten substrates was 2.02 μm, and the maximum deviation from the average value was ±1.0%, which shows high development uniformity of the substrates.

According to the present invention, it is possible to achieve the development, in which the uniformity of resist patterns in the substrate surface is high, with high reproducibility.

Consequently, devices having identical characteristics can be highly integrated in a large substrate, which provides a thin-film transistor substrate, a liquid crystal display device and the like having high performance.

What is claimed is:

1. A resist developing apparatus, comprising:

a rotating substrate holder whose rotation speed is variable;

a nozzle for supplying developer onto a resist formed on a substrate; and means for supplying the developer to said nozzle, wherein said nozzle includes a spray nozzle and a drip nozzle located immediately adjacent to and parallel to said spray nozzle; and wherein said spray nozzle and said drip nozzle are connected to said developer supply means through at least one selector valve.

2. A resist developing apparatus according to claim 1, further comprising means for moving a jetting portion of said drip nozzle from a center toward an outer periphery of said substrate.

3. A resist developer apparatus according to claim 1, wherein said spray nozzle and said drip nozzle are arranged to supply the developer in a direction perpendicular to a surface of the substrate.

4. A resist developer apparatus according to claim 1, wherein said spray nozzle and said drip nozzle are connected to said developer supply means through a single three-way valve.

* * * * *